United States Patent
Zhai et al.

(10) Patent No.: US 11,387,665 B2
(45) Date of Patent: Jul. 12, 2022

(54) COMPONENT THROTTLING POWER BACKUP DEVICE CHARGING SYSTEM

(71) Applicant: Dell Products L.P., Round Rock, TX (US)

(72) Inventors: Haifang Zhai, Shanghai (CN); Wei Dong, Shanghai (CN); Xizhi Cui, Shanghai (CN)

(73) Assignee: Dell Products L.P., Round Rock, TX (US)

( * ) Notice: Subject to any disclaimer, the term of this patent is extended or adjusted under 35 U.S.C. 154(b) by 320 days.

(21) Appl. No.: 16/671,936

(22) Filed: Nov. 1, 2019

(65) Prior Publication Data
US 2021/0135460 A1 May 6, 2021

(30) Foreign Application Priority Data

Sep. 26, 2019 (CN) .......................... 201910915490.0

(51) Int. Cl.
| | |
|---|---|
| *H02J 7/00* | (2006.01) |
| *G06F 1/20* | (2006.01) |
| *G05B 15/02* | (2006.01) |
| *G06F 1/18* | (2006.01) |

(52) U.S. Cl.
CPC .............. *H02J 7/007* (2013.01); *G05B 15/02* (2013.01); *G06F 1/182* (2013.01); *G06F 1/20* (2013.01); *G06F 2200/201* (2013.01)

(58) Field of Classification Search
CPC . G06F 1/20; G06F 1/182; G06F 1/188; G06F 1/206; G06F 1/3206; H02J 7/007; G05B 15/02
See application file for complete search history.

(56) References Cited

U.S. PATENT DOCUMENTS

| | | | | |
|---|---|---|---|---|
| 5,241,259 A | * | 8/1993 | Patino | H02J 7/007192 320/150 |
| 6,936,372 B1 | * | 8/2005 | Jagota | H01M 10/633 429/50 |
| 2007/0168151 A1 | * | 7/2007 | Kernahan | G01K 7/425 702/132 |
| 2008/0313492 A1 | * | 12/2008 | Hansen | G06F 1/206 714/5.11 |
| 2010/0203928 A1 | * | 8/2010 | Lopata | H02J 7/007188 455/573 |

(Continued)

*Primary Examiner* — Vincent H Tran
(74) *Attorney, Agent, or Firm* — Joseph Mencher

(57) ABSTRACT

A component throttling power backup charging system includes a chassis defining a chassis housing and a chassis air inlet to the chassis housing, at least one component located in the chassis housing and adjacent the chassis air inlet, and a power backup device located opposite the at least one component from the chassis air inlet. The power backup device determines that a charging condition has been satisfied. The power backup device then determines that a temperature of air being provided to the power backup device exceeds a threshold temperature and, in response, transmits a throttling instruction that is configured to cause throttling of the at least one component. The power backup device subsequently determines that the temperature of the air being provided to the power backup device no longer exceeds the threshold temperature and, in response, performs charging operations.

20 Claims, 11 Drawing Sheets

(56) References Cited

U.S. PATENT DOCUMENTS

| | | | |
|---|---|---|---|
| 2013/0258582 A1* | 10/2013 | Shelnutt | G05D 23/1927 |
| | | | 361/679.48 |
| 2014/0312843 A1* | 10/2014 | Chen | H01M 10/48 |
| | | | 320/112 |
| 2015/0123595 A1* | 5/2015 | Hussain | H02J 7/04 |
| | | | 320/107 |
| 2017/0279666 A1* | 9/2017 | Alshinnawi | H04L 41/0672 |
| 2018/0287949 A1* | 10/2018 | Kumar | G06F 1/206 |
| 2019/0317592 A1* | 10/2019 | Mugunda | G06F 1/3268 |
| 2019/0317672 A1* | 10/2019 | Linnen | G06F 1/206 |
| 2020/0262310 A1* | 8/2020 | Ono | B60R 16/03 |
| 2021/0089108 A1* | 3/2021 | Iyer | G06F 1/30 |

\* cited by examiner

COMPONENT THROTTLING POWER BACKUP DEVICE CHARGING SYSTEM

CROSS-REFERENCE TO RELATED APPLICATIONS

This application claims priority to Chinese Application Serial No. 201910915490.0, filed Sep. 26, 2019, the disclosure of which is incorporated herein by reference in its entirety.

BACKGROUND

The present disclosure relates generally to information handling systems, and more particularly to utilizing component throttling to charge a power backup device in an information handling system.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, server devices, sometimes utilize power backup devices for addressing power losses to components in the server device. For example, Battery Backup Unit (BBU) devices are often provided for memory systems (e.g., Dynamic Random Access Memory (DRAM) devices) in server devices in order to provide power to the memory system during a power loss in order to prevent the loss of data stored on those memory devices. However, issues can arise with respect to the charging of BBU devices, particularly in high temperature environments. For example, many server devices are configured with components located between an air inlet on the server chassis and the fan devices that provide airflow for cooling the BBU device, and the operation of those components provides for the heating of the air entering the server device before the fan devices provide that air to the BBU device. Furthermore, conventional BBU devices may include power storage subsystems provided by, for example, Lithium-based batteries, which may be configured to halt charging operations for the power storage subsystem in the BBU device when the temperature of air provided to the BBU device exceeds a maximum temperature (e.g., 50-60 degrees Celsius). As such, server devices utilized in high temperature environments may experience charging interruptions with their BBU devices, which raises the possibility of power loss events resulting in data on the memory system becoming unavailable or lost.

Accordingly, it would be desirable to provide an improved power backup device charging system absent the issues discussed above.

SUMMARY

According to one embodiment, an Information Handling System (IHS) includes a processing system; and a memory system that is coupled to the processing system and that includes instructions that, when executed by the processing system, cause the processing system to provide a power backup engine that is configured to: determine that a charging condition has been satisfied; determine that a temperature of air being provided to a power backup device exceeds a threshold temperature and, in response, transmit a throttling instruction that is configured to cause throttling of at least one component that is located between the power backup device and an air inlet; and determine, subsequent to transmitting the throttling instruction, that the temperature of the air being provided to the power backup device no longer exceeds the threshold temperature and, in response, perform charging operations.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
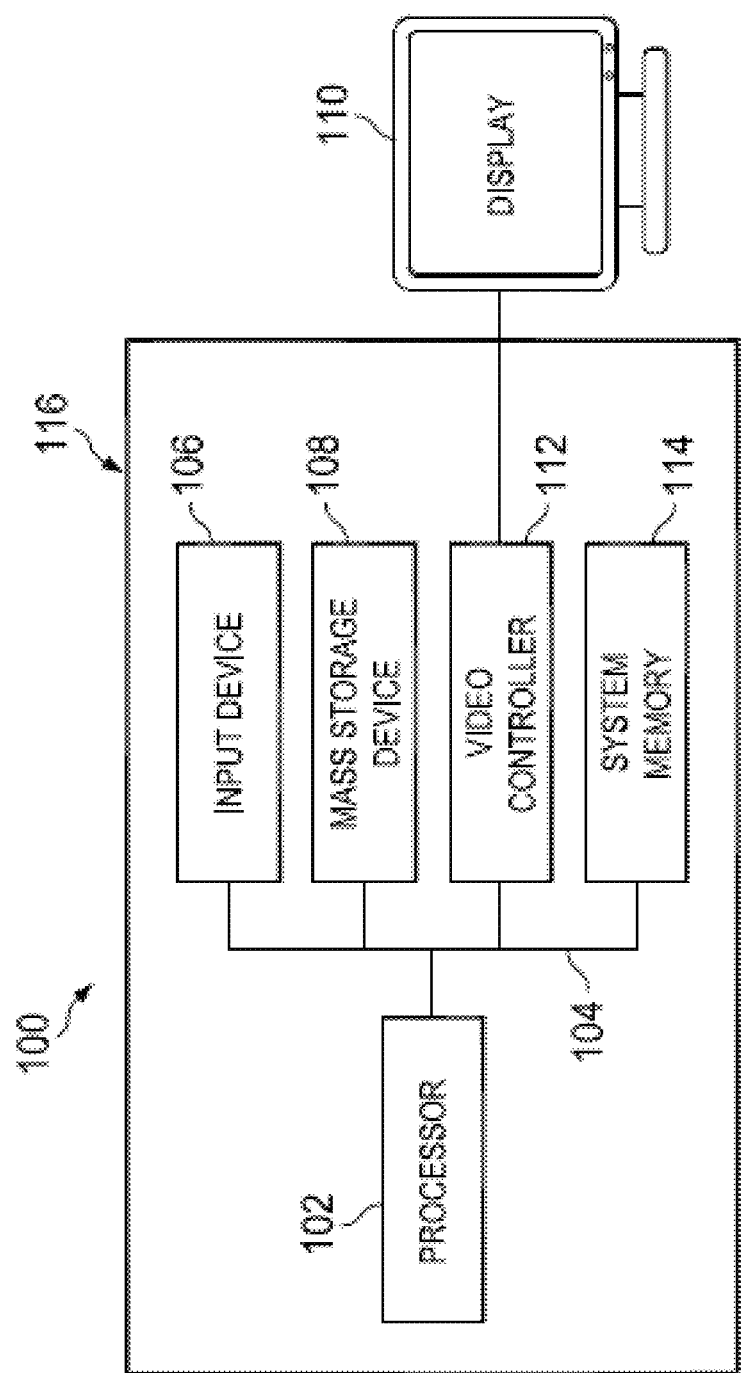
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
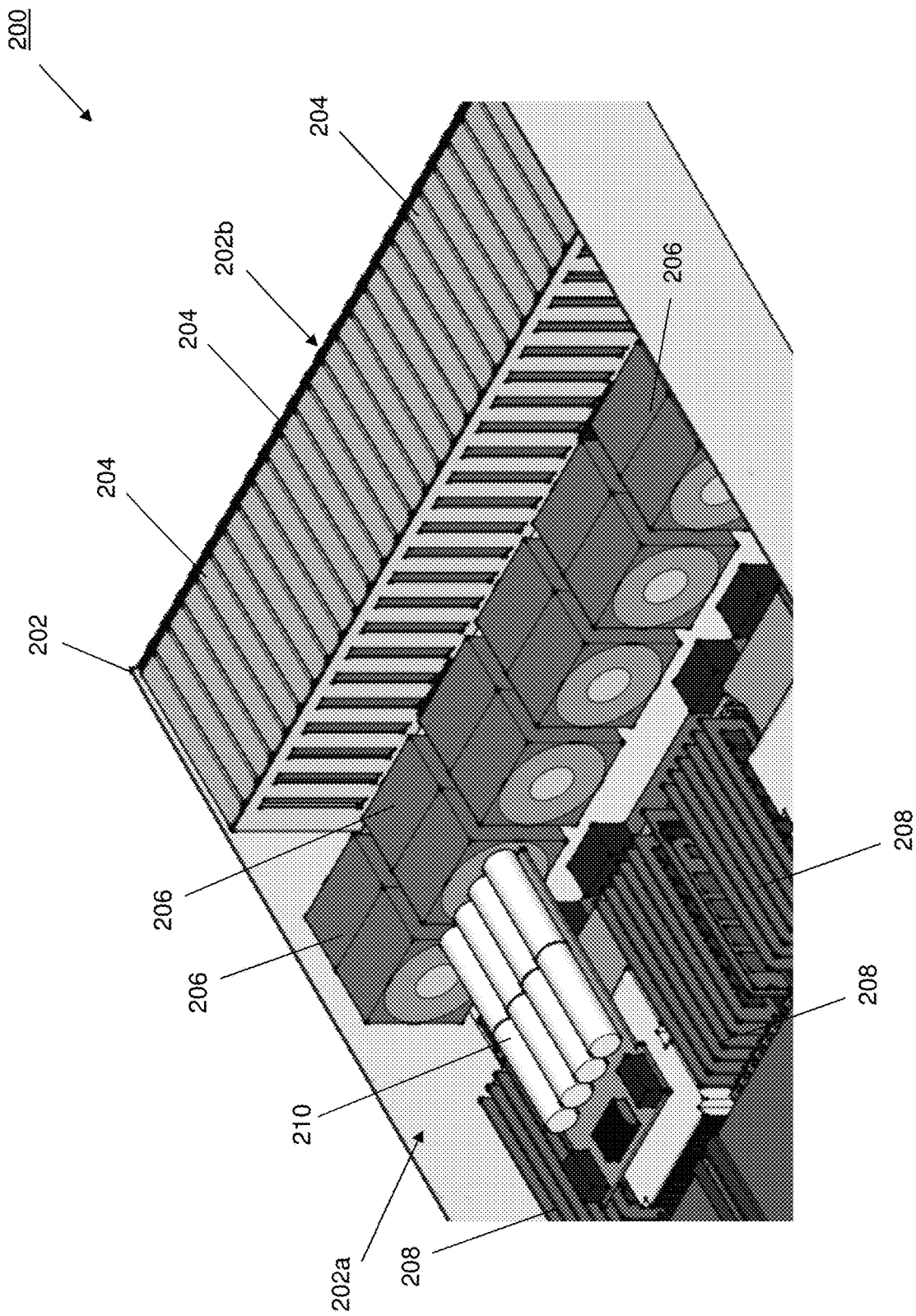
FIG. 2 is a perspective view illustrating an embodiment of a server device that may include the component throttling power backup device charging system of the present disclosure.

Referring now to FIG. 2, an embodiment of a server device 200 is illustrated. In an embodiment, the server device 200 may be provided by the IHS 100 discussed above with reference to FIG. 1, and/or may include some or all of the components of the IHS 100. However, while illustrated and discussed as provided in a server device 200, one of skill in the art in possession of the present disclosure will recognize that the component throttling power backup device charging system of the present disclosure may be provided in a variety of different devices (e.g., networking devices, storage devices, desktop computing devices, laptop/notebook computing devices, and/or other computing devices that would be apparent to one of skill in the art in possession of the present disclosure) while remaining within the scope of the present disclosure as well. In the illustrated embodiment, the server device 200 includes a chassis 202 that defines a chassis housing 202a, as well as a chassis air inlet 202b that, while obscured in FIG. 2, will be recognized by one of skill in the art in possession of the present disclosure as being provided by vents, apertures, and/or other openings that may extend through a chassis wall to the chassis housing 202a, as well as being provided by any other air inlet configurations known in the art.

In the illustrated embodiment, a plurality of components 204 are located in the chassis housing 202a immediately adjacent the chassis air inlet 202b. In some of the examples below, the components 204 may be provided by storage devices such as Solid State Drives (SSDs), Hard Disk Drives (HDDs), and/or any other storage device known in the art. However, while described as storage devices, one of skill in the art in possession of the present disclosure will recognize that the components may be provided by any heat producing component known in the art while remaining within the scope of the present disclosure as well. Furthermore, FIG. 2 illustrates a plurality of fan devices 206 located in the chassis housing 202a adjacent the components 204 and opposite the components 204 from the chassis air inlet 202b, as well as a plurality of memory devices 208 and a Battery Backup Unit (BBU) device 210 located in the chassis housing 202a and opposite the fan devices 206 from the components 204 and the chassis air inlet 202b. However, while discussed as a BBU device below, one of skill in the art in possession of the present disclosure will recognize that the BBU device 210 may be replaced by any of a variety of power backup device technologies while remaining within the scope of the present disclosure as well. While a specific server device 200 has been illustrated and described, one of skill in the art in possession of the present disclosure will recognize that the devices providing the component throttling power backup device charging system of the present disclosure may include a variety of components and component configurations while remaining within the scope of the present disclosure as well.

Figure 3:
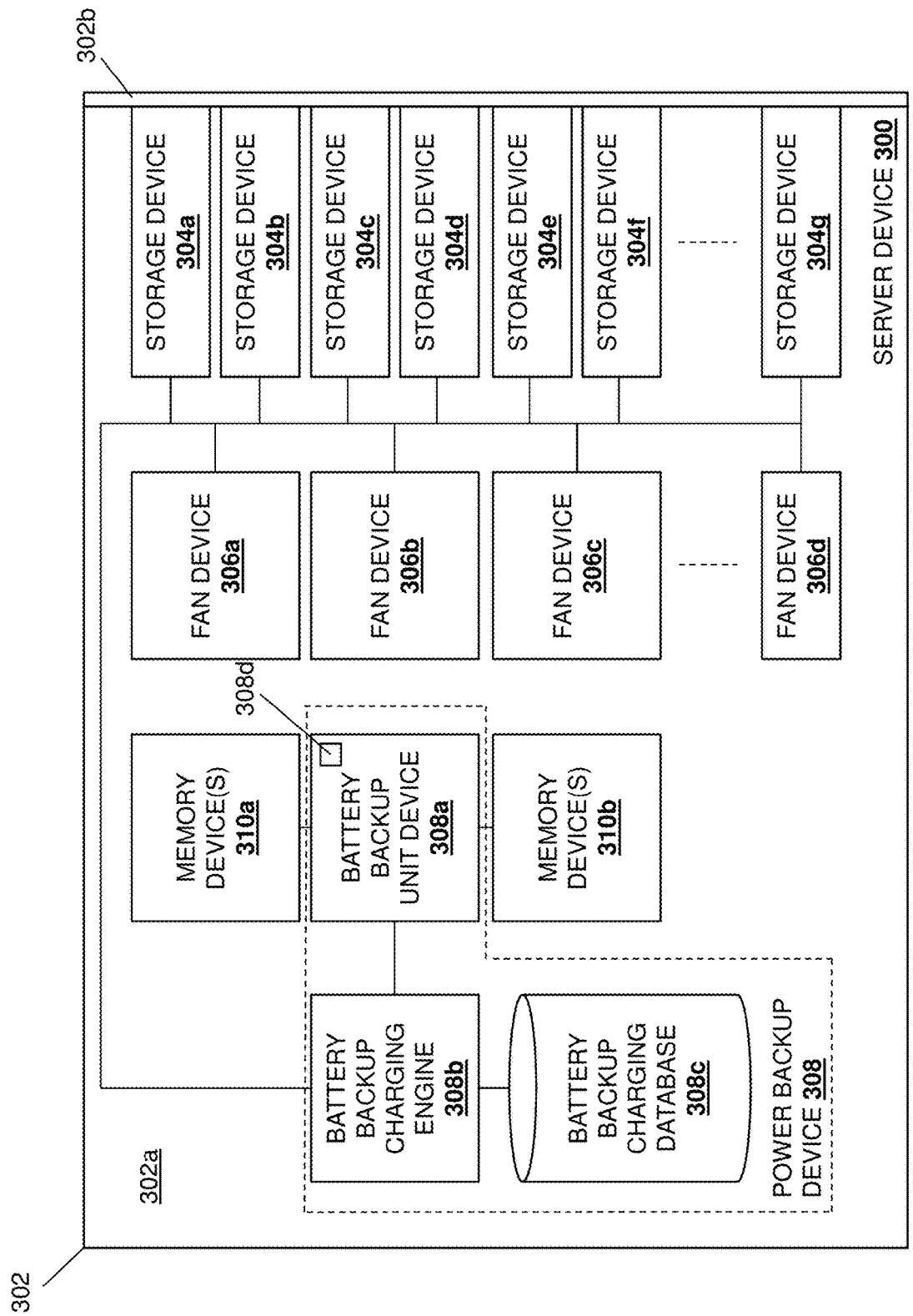
FIG. 3 is a schematic view illustrating an embodiment of a server device that may include the component throttling power backup device charging system of the present disclosure.

Referring now to FIG. 3, an embodiment of a server device 300 is illustrated that is similar to the server device 200 discussed above with reference to FIG. 2 and provided for purposes of the examples discussed below. In an embodiment, the server device 300 may be provided by the IHS 100 discussed above with reference to FIG. 1, and/or may include some or all of the components of the IHS 100. However, while illustrated and discussed as provided in a server device 300, one of skill in the art in possession of the present disclosure will recognize that the component throttling power backup device charging system of the present disclosure may be provided in a variety of different devices (e.g., networking devices, storage devices, desktop computing devices, laptop/notebook computing devices, and/or other computing devices that would be apparent to one of skill in the art in possession of the present disclosure) while remaining within the scope of the present disclosure as well. In the illustrated embodiment, the server device 300 includes a chassis 302 that defines a chassis housing 302a, as well as a chassis air inlet 302b that may be provided by vents, apertures, and/or other openings that extend through a chassis wall to the chassis housing 202a, as well as by any other air inlet configurations known in the art.

In the illustrated embodiment, a plurality of storage devices 304a, 304b, 304c, 304d, 304e, 304f, and up to 304g are located in the chassis housing 302a immediately adjacent the chassis air inlet 302b. For example, the storage devices 304a-304g may e provided by Solid State Drives (SSDs), Hard Disk Drives (HDDs), and/or any other storage device known in the art. However, while described as storage devices, one of skill in the art in possession of the present disclosure will recognize that the storage devices 304a-304g may be replaced by any heat producing component known in the art while remaining within the scope of the present disclosure as well. Furthermore, FIG. 3 illustrates a plurality of fan devices 306a, 306b, 306c, and up to 306d located in the chassis housing 202a, with the fan device 306a located adjacent the components 304a and 304b and opposite the components 304a and 304b from the chassis air inlet 302b, the fan device 306b located adjacent the components 304c and 304d and opposite the components 304c and 304d from the chassis air inlet 302b, the fan device 306c located adjacent the components 304e and 304f and opposite the components 304e and 304f from the chassis air inlet 302b, and the fan device 306d located adjacent the component 304g and opposite the component 304g from the chassis air inlet 302b.

Furthermore, a power backup device 308 may be housed in the chassis housing 302a and may include a processing system and a memory system that is coupled to the processing system and that includes instructions that, when executed by the processing system, cause the processing system to provide a power backup engine that is configured to perform the functionality of the power backup engines and/or power backup devices discussed below. In the embodiment illustrated in FIG. 3, the power backup device 308 is provided by a Battery Backup Unit (BBU) device 308a that may include any of a variety of power storage subsystems known in the art (e.g., batteries, capacitors, etc.), a battery backup charging engine 308b that may be configured to perform the functionality of the power backup device 308 discussed below, and a battery backup unit charging database 308c that may store any of the information utilized by the battery backup charging engine 308b as discussed below. In the illustrated embodiment, a temperature sensor 308d is included in the BBU device 308a, although one of skill in the art in possession of the present disclosure will recognize that the temperature sensor 308d may be provided outside of the BBU device 308a and/or in any location in which it may be configured to measure the temperature of the air being provided to the BBU device 308a. Furthermore, the power backup device 308 is illustrated as coupled to each of a plurality of memory devices 310a and 310b that are located in the chassis housing 302a, as well as to each of the storage devices 304a-g and each of the fan devices 306a-d.

In some examples, the power backup device 308 may be provided by a single device such as a BBU that is configured to perform all of the functionality of the power backup device 308 discussed below. However, in other examples, the power backup device 308 may be provided by multiple devices such as, for example, the BBU device 308a provided by a BBU, the battery backup charging engine 308b provided by a Baseboard Management Controller (BMC) device, and the battery backup charging database 308c that may be provided one or more of the BBU and the BMC device. As such, FIG. 3 illustrates how a multi-device power backup device 308 may include the BBU device 308a (e.g., a BBU) coupled to each of the memory devices 310a and 310b, and the battery backup charging engine 308b (e.g., a BMC device) coupled to the BBU device 308a, the battery backup charging database 308c, and each of the storage devices 304a-g and fan devices 306a-d. However, in yet other embodiments, the functionality of the battery backup charging engine 308b may be provided by some combination of a BBU and BMC device while remaining within the scope of the present disclosure as well. As such, while a specific server device 300 has been illustrated and described, one of skill in the art in possession of the present disclosure will recognize that the devices providing the component throttling power backup device charging system of the present disclosure may include a variety of components and component configurations while remaining within the scope of the present disclosure as well.

Figure 4:
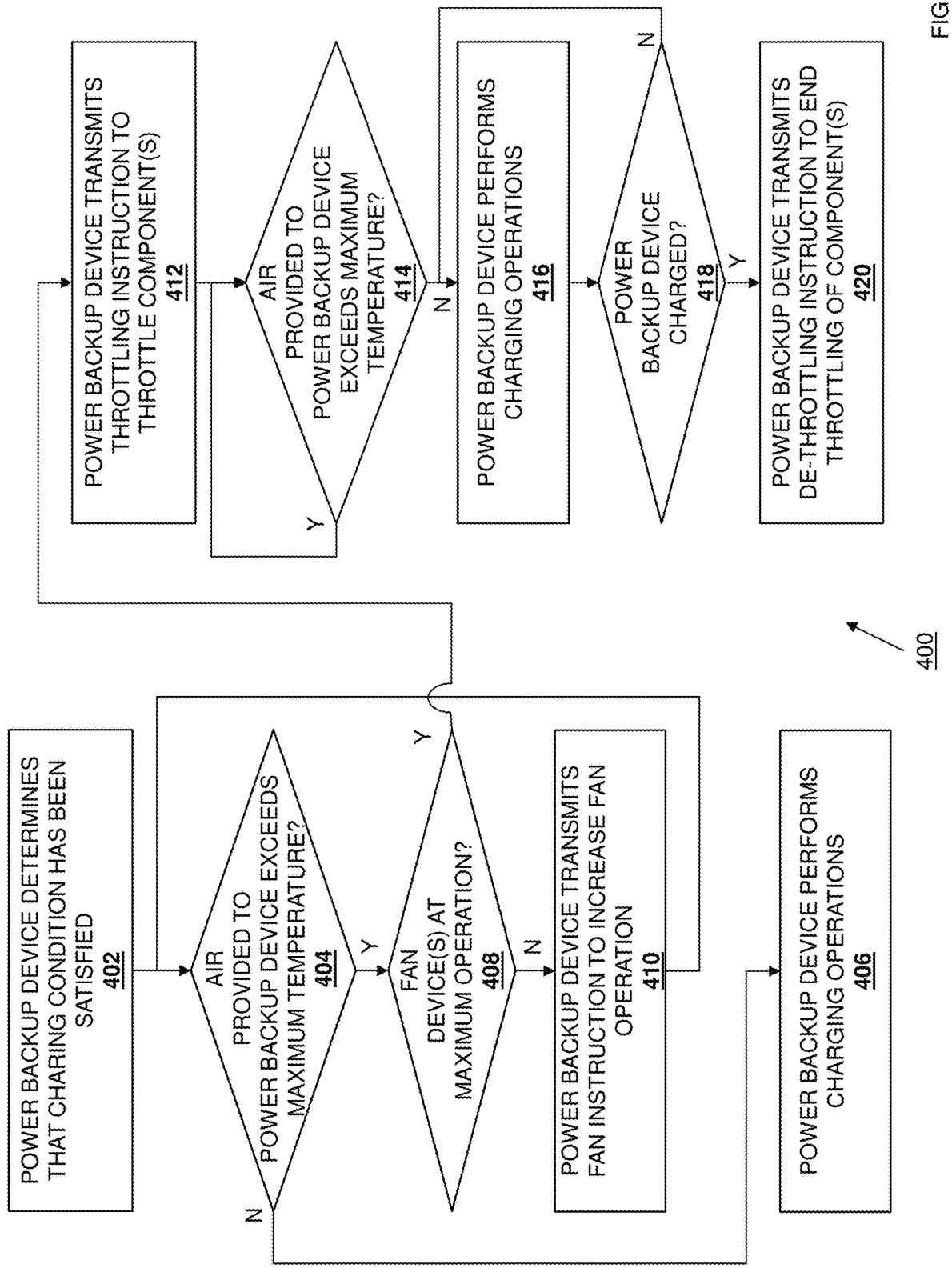
FIG. 4 is a flow chart illustrating an embodiment of a method for providing component throttling power backup device charging.

Referring now to FIG. 4, an embodiment of a method 400 for providing component throttling power backup device charging is illustrated. As discussed below, the systems and methods of the present disclosure provide an adaptive component throttling mechanism for a power backup device that may require charging in relatively high temperature environments that would otherwise result in air being provided to the power backup device at a temperature that prevents charging of the power backup device. For example, a chassis may define a chassis housing and a chassis air inlet to the chassis housing, and at least one component may be located in the chassis housing and adjacent the chassis air inlet. A power backup device located opposite the at least one component from the chassis air inlet may determine that a charging condition has been satisfied, and then may determine that a temperature of air being provided to the power backup device exceeds a threshold temperature. In response, the power backup device transmits a throttling instruction that is configured to cause throttling of the at least one component, which reduces the temperature of the at least one components and provides a corresponding reduction in the heating of the air that is provided to the power backup device. As such, subsequent to transmitting the throttling instruction, the power backup device may determine that the temperature of the air being provided to the power backup device no longer exceeds the threshold temperature and, in response, may perform charging operations. As such, power backup device charging in high temperature environments is enabled by throttling components in order to reduce the heating of the air that is provided to the power backup device until that air is below a temperature that allows for charging of the power backup device.

In some embodiments, during or prior to the method 400, a mapping of the components 204/storage devices 304a-304g (e.g., identifiers for the component slots/storage device slots in which those components/storage devices are located), the fan devices 206/306a-306d, and/or the BBU device 210/308a may be stored in the battery backup charging database 308c. As discussed below, the mapping of the components 204/storage devices 304a-304g, the fan devices 206/306a-306d, and/or and the BBU device 210/308a may be provided by any information that identifies components 204/storage devices 304a-304g that are located in the path of air that is provided by the fan devices 306a-306d to cool the power storage subsystem (e.g., a battery, capacitor, etc.) in the BBU device 210/308a. In many examples, the component/power backup device mapping (e.g., the storage devices/fan device/BBU device mapping in the examples below) may be provided in the battery backup charging database 308c as part of the manufacture of the server device 200/300. As would be appreciated by one of skill in the art in possession of the present disclosure, the manufacture of the server device 300 may provide for the identification of the relative physical locations of the BBU device 308a, the fan devices 306a-306b, and the storage devices 304a-304g, which allows for a mapping of the BBU device 308a with the storage devices 304c and 304d that are positioned in the chassis housing 302a such that they are configured to heat air that enters the chassis housing 302a via the air inlet 302b before that air is drawn by the fan device 306b and provided to the BBU device 308a for cooling. As such, in different examples, the mapping of the BBU device 308a, the fan device 306*b*, and the storage devices 304*c* and 304*d* may be provided by an administrator of the server device 300, determined by the BMC device (discussed above) based on relative location data for the subsystems in the server device 300, and/or identified in any other manner that would be apparent to one of skill in the art in possession of the present disclosure.

However, in some examples, the power backup device 308 may be configured to determine the mapping of the components 204/storage devices 304*a*-304*g*, the fan devices 206/306*a*-306*d*, and/or the BBU device 210/308*a*. For example, the battery backup charging engine 308*b* may be configured to perform training operations that result in the identification of the components 204/storage devices 304*a*-304*g* that are located in the path of air that is provided by the fan devices 306*a*-306*d* to cool the power storage subsystem (e.g., a battery, capacitor, etc.) in the BBU device 210/308*a*. In a specific example, during Power On Self Test (POST) operations for the server device 300, the battery backup charging engine 308*b* may cause the fan devices 306*a*-306*d* to operate as some relatively low fan operation level, and then cause each of the storage devices 304*a*-304*g* to operate at a relatively high level (e.g., full Input/Output (I/O) loading) in a sequential manner, while monitoring the temperature of air provided to the BBU device 308*a* by the fan device 306*b*.

As will be appreciated by one of skill in the art in possession of the present disclosure, such training operations will result in the detection of relatively significant increases in the temperature of the air provided to the BBU device 308*a* by the fan device 306*b* when the storage devices 304*c* and 304*d* are operated at the relatively high level discussed above, and thus the mapping may be created of the BBU device 308*a* with the fan device 306*b* and the storage devices 304*c* and 304*d* that are positioned in the chassis housing 302*a* such that they heat air that enters the chassis housing 302*a* via the air inlet 302*b* before that air is provided by the fan device 306*b* to the BBU device 308*a* for cooling, and that mapping may be stored in the battery backup charging database 308*c*. However, while a specific example of training operations has been described, one of skill in the art in possession of the present disclosure will recognize that a variety of techniques may be utilized to determine the mapping of the BBU device 308*a* with the storage devices 304*c* and 304*d* and the fan device 306*b* while remaining within the scope of the present disclosure as well. Furthermore, while a BBU device/fan device/storage devices configuration is illustrated that provides for the mapping of the BBU device with a single fan device and two storage devices, one of skill in the art in possession of the present disclosure will recognize that different BBU device/fan device/storage devices configurations may result in mappings of the BBU device with different numbers of fan devices (e.g., more than one) and/or storage devices (e.g., a single storage device, more than two storage devices, etc.) while remaining within the scope of the present disclosure as well.

The method 400 begins at block 402 where a power backup device determines that a charging condition has been satisfied. In an embodiment, at block 402, the BBU device 308*a* may determine that a charging condition for initiating charging of the power storage subsystem in the BBU device 308*a* has been satisfied. For example, charging conditions for the BBU device 308*a* may be stored in the BBU device 308*a*, and the BBU device 308*a* may monitor itself and/or other charging condition data sources to determine whether charging conditions for the BBU device 308*a* have been satisfied. In one specific example, a charging condition for the BBU device 308*a* may provide a time at which the BBU device 308*a* should be charged, a time period after which the BBU device 308*a* should be charged, and/or any other timing-based charging conditions that would be apparent to one of skill in the art in possession of the present disclosure. As such, the BBU device 308*a* may operate at block 402 to determine that a current time satisfies the charging condition that provides a time at which the BBU device 308*a* should be charged, determine that a time period has expired to satisfy the charging condition that provides for charging of the BBU device 308*a* after that time period, and/or may determine any other charging condition information that satisfies a charging condition for the power storage subsystem in the BBU device 308*a*.

In another specific example, a charging condition for the BBU device 308*a* may provide a charge level of the BBU device 308*a* below which the BBU device 308*a* should be charged, and/or any other charge-based charging conditions that would be apparent to one of skill in the art in possession of the present disclosure. As such, the BBU device 308*a* may operate at block 402 to determine that a current charge level of the BBU device 308*a* satisfies the charging condition that provides a charge level below which the BBU device 308*a* should be charged. In yet another specific example, a charging condition for the BBU device 308*a* may provide for charging of the BBU device 308*a* in response to a manual command provided by an administrator, and/or any other manual charging conditions that would be apparent to one of skill in the art in possession of the present disclosure. As such, the BBU device 308*a* may operate at block 402 to determine that a manual command has been received that satisfies the charging condition that provides for charging of the BBU device 308*a*. However, while a few specific examples have been described, one of skill in the art in possession of the present disclosure will recognize that charging conditions for the BBU device 308*a* may be satisfied in a variety of manners that will fall within the scope of the present disclosure as well.

Figure 5A:
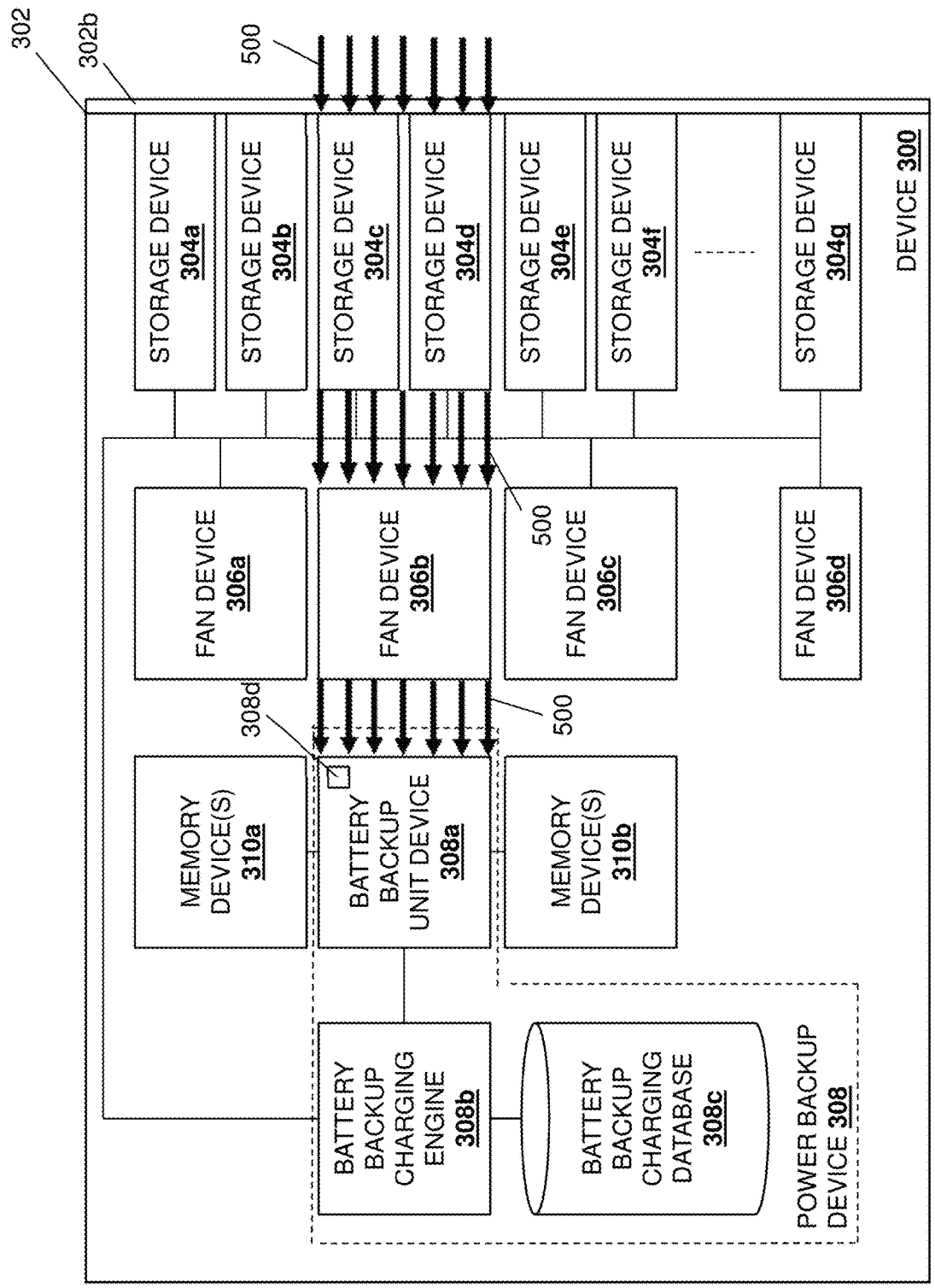
FIG. 5A is a schematic view illustrating an embodiment of the server device of FIG. 3 operating during the method of FIG. 4.

The method 400 then proceeds to decision block 404 where it is determined whether air provided to the power backup device exceeds a maximum temperature. In an embodiment, at decision block 404, the BBU device 308*a* may operate to determine a temperature of air provided by the fan device 306*b* to the BBU device 308*a* (e.g., air provided to a BBU device air inlet on the BBU device 308*a* that allows the air to be moved past the power storage subsystem in the BBU device 308*a* in order to cool that power storage subsystem.) For example, with reference to FIG. 5A, the fan device 306*a* may operate to draw air 500 in through the air inlet 302*b* in the chassis 302 such that that air 500 passes the storage devices 304*c* and 304*d* and enters the fan device 306*b*, and is provided by the fan device 306*b* to the BBU device 308*a* (e.g., the BBU device air inlet on the BBU device 308*a* as discussed above). As will be appreciated by one of skill in the art in possession of the present disclosure, the operation of the storage devices 304*c* and 304*d* will produce heat that will increase the temperature of the air 500 that passes those storage devices. Thus, at block 404, the BBU device 308*a* may retrieve temperature sensor data from the temperature sensor 308*d*, which as discussed above is positioned in a manner that provides for the reporting of the temperature of the air 500 provided by the fan device 306*a* to the BBU device 308*a*, and determine whether that temperature sensor data is indicative of a temperature that exceeds a maximum temperature for the BBU device 308*a* (e.g., a maximum temperature (e.g., 50-60 degrees Celsius) at which the power storage subsystem in the BBU device 308a is allowed to charge, and above which charging of that power storage subsystem is disabled.)

If, at decision block 406, it is determined that the air provided to the power backup device does not exceed the maximum temperature, the method 400 proceeds to block 406 where the power backup device performs charging operations. In an embodiment, at block 406 and in the event that the air provided to the BBU device 308a does not exceed the maximum temperature discussed above, the BBU device 308a may operate to charge the power storage subsystem in the BBU device 308a. For example, at block 406, power may be enabled to the power storage subsystem in the BBU device 308a in order to charge the battery, capacitor, and/or other power storage subsystem to a desired level. As such, in the event that the air provided to the BBU device 308a does not exceed the maximum temperature, that BBU device 308a may be charged such that it may provide power to any components (e.g., the memory devices 310a and/or 310b) in the server device 300 in the event of a power loss.

Figure 5B:
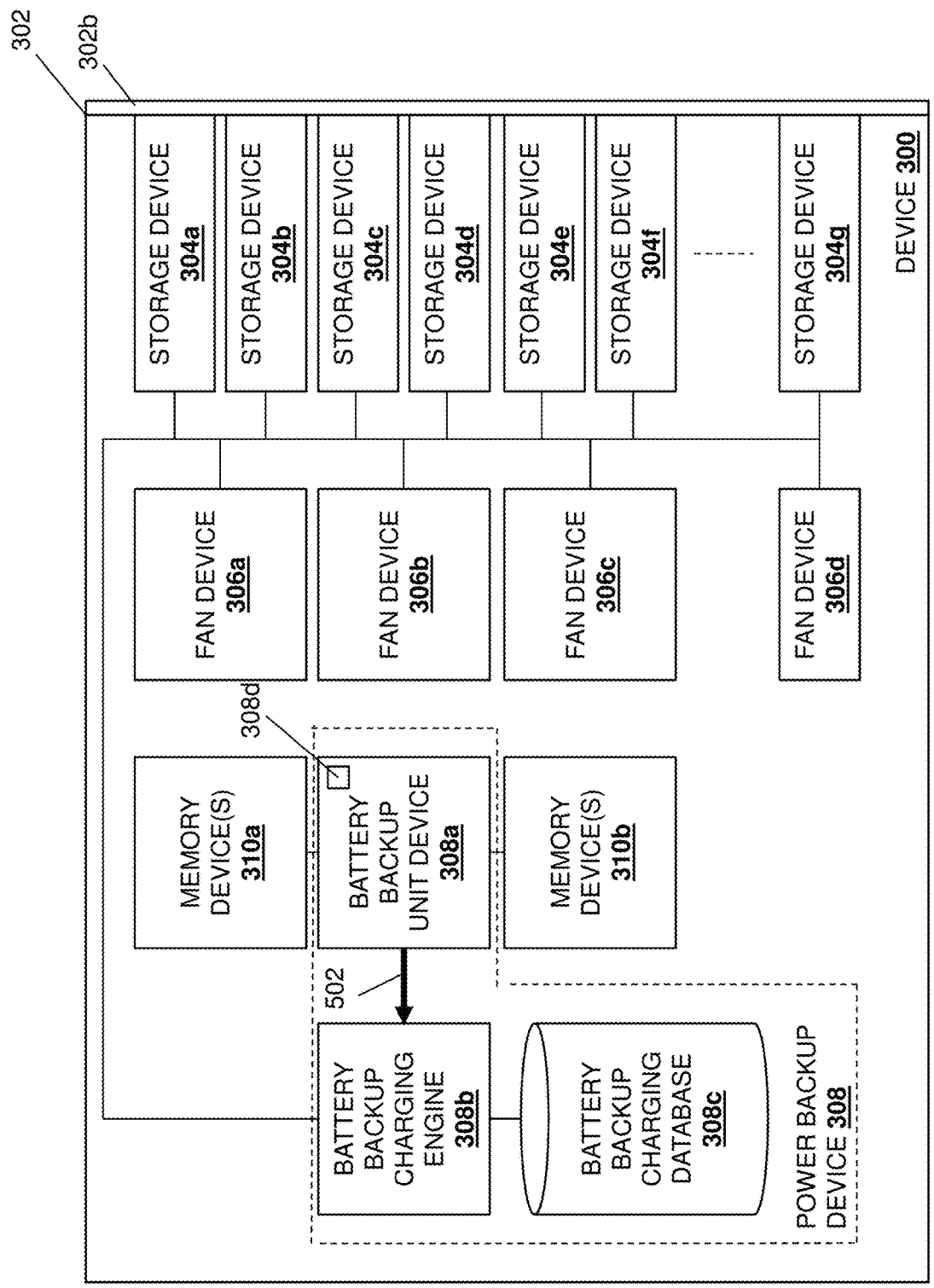
FIG. 5B is a schematic view illustrating an embodiment of the server device of FIG. 3 operating during the method of FIG. 4.
Figure 5C:
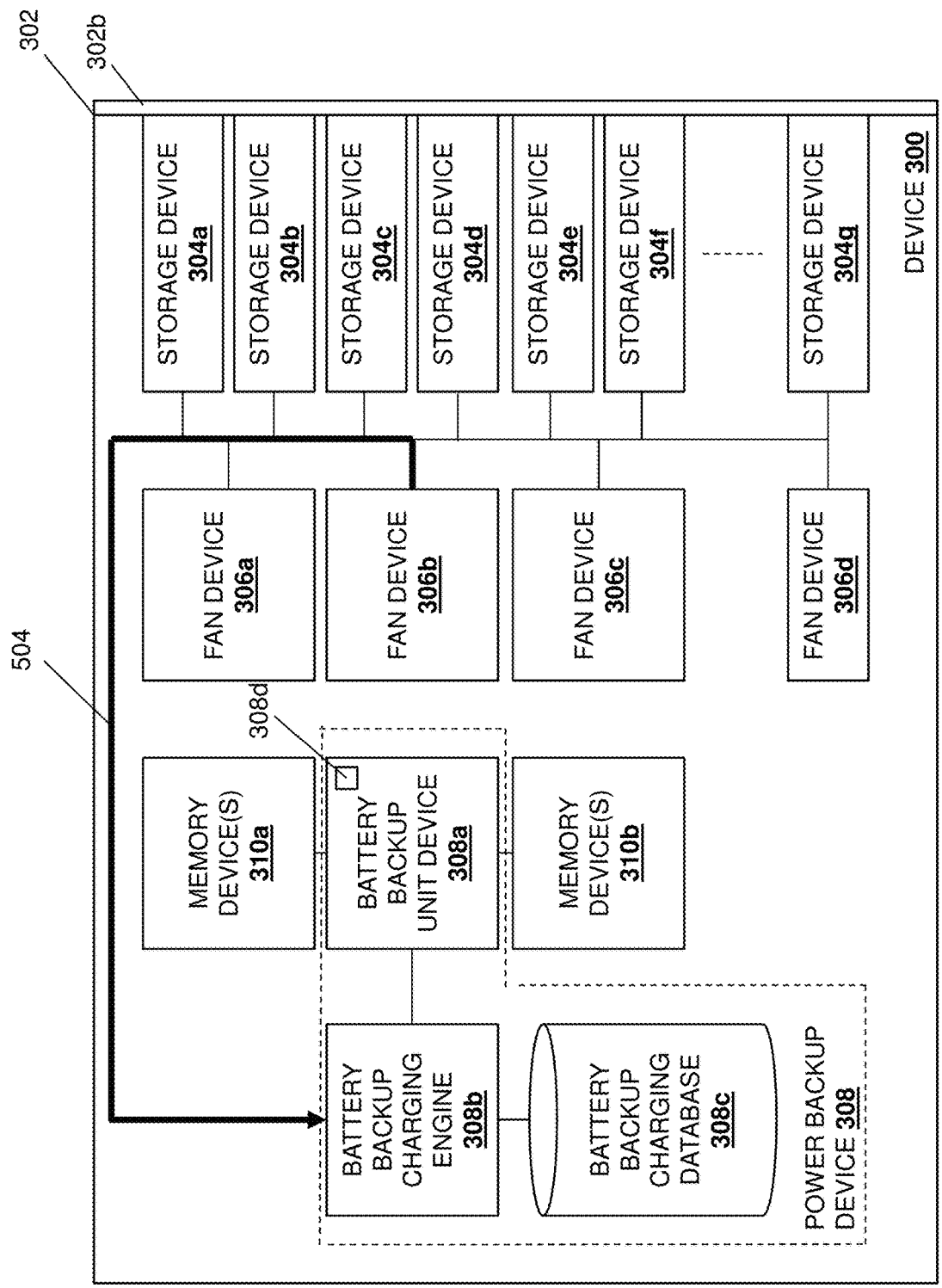
FIG. 5C is a schematic view illustrating an embodiment of the server device of FIG. 3 operating during the method of FIG. 4.

However, if at decision block 406 it is determined that the air provided to the power backup device exceeds the maximum temperature, the method 400 proceeds to decision block 408 where it is determined whether fan device(s) are at maximum operation. With reference to FIG. 5B, in an embodiment of decision block 408 and in response to determining that the air provided to the BBU device 308a exceeds the maximum temperature discussed above, the BBU device 308a may transit an over-temperature report 502 (e.g., an Intelligent Platform Management Interface (IPMI) command) to the battery backup charging engine 308b that reports that the maximum temperature of air provided to the BBU device 308a has been exceeded. In response to receiving the over-temperature report 502, the battery backup charging engine 308b may operate to determine whether the fan device 306b is operating at a maximum operation level (e.g., a maximum fan speed for the fan device 306b). As discussed above, the BBU device 308a may be mapped to the fan device 306b in the battery backup charging database 308c. As such, with reference to FIG. 5C, the battery backup charging engine 308b may retrieve operating data 504 from the fan device 306b and determine whether that operating data 504 indicates that the fan device 306b is operating at its maximum operation level. However, while a specific example has been provided, one of skill in the art in possession of the present disclosure will recognize that the operating level of the fan device 306b may be determined in a variety of manners that will fall within the scope of the present disclosure as well.

Figure 5D:
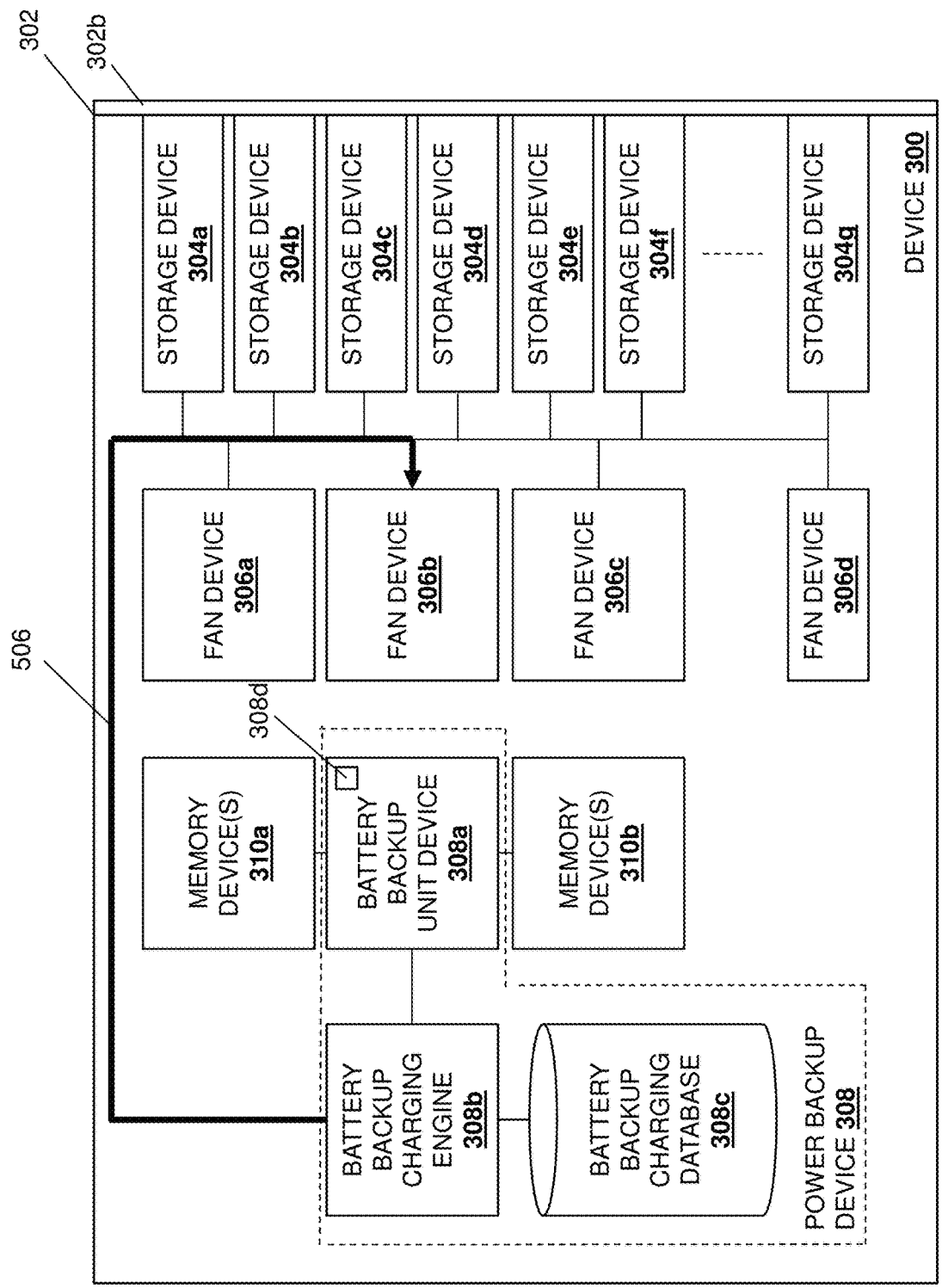
FIG. 5D is a schematic view illustrating an embodiment of the server device of FIG. 3 operating during the method of FIG. 4.

If, at decision block 408, it is determined that the fan device(s) are not at maximum operation, the method 400 proceeds to block 410 where the power backup device transmits a fan instruction to increase fan operation. With reference to FIG. 5D, in an embodiment of block 410 and in response to the battery backup charging engine 308b determining that the operating data 504 indicates that the fan device 306b is operating below its maximum operation level, the battery backup charging engine 308b may transmit a fan instruction 506 to the fan device 306b to increase its fan operation. As such, the fan device 306b may receive the fan instruction 506 and, in response, increase its fan operation, and one of skill in the art in possession of the present disclosure will recognize that increased fan operation (e.g., an increase in fan speed of the fan device 306b) will cause the fan to draw air 500 at an increased rate past the storage devices 304c and 304d, thus decreasing the heating of that air 500 by those storage devices 304c and 304d, and reducing the temperature of the air 500 provided by the fan device 306b to the BBU device 308a. The method 400 then returns to decision block 404. As will be appreciated by one of skill in the art in possession of the present disclosure, the method 400 may then loop such that the operating level of the fan device 306b is increased until the air provided to the power backup device no longer exceeds the maximum temperature for the power backup device, or the fan device 306b reaches its maximum operating while and the air being provided to the power backup device continues to exceed the maximum temperature for the power backup device.

Figure 5E:
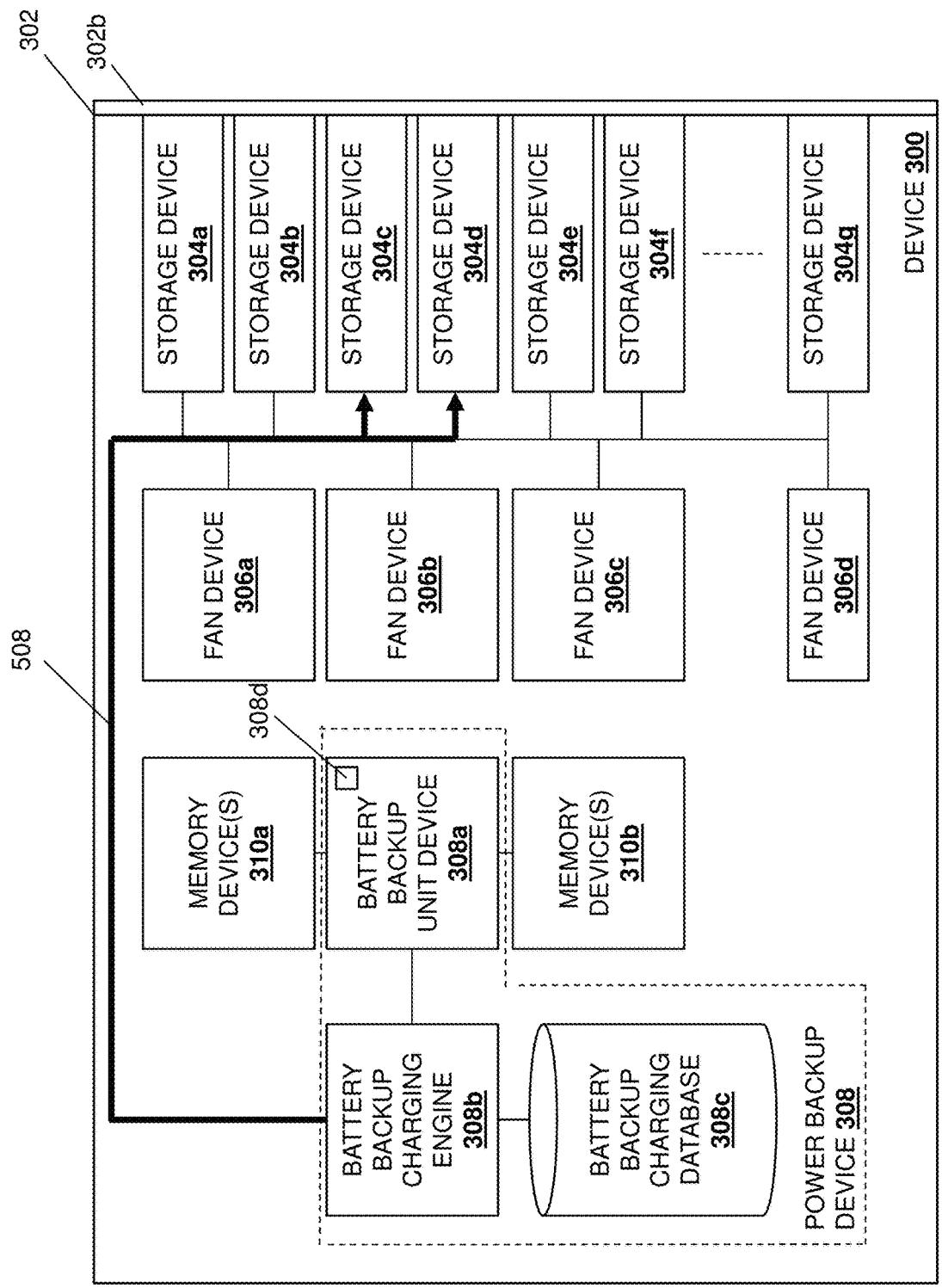
FIG. 5E is a schematic view illustrating an embodiment of the server device of FIG. 3 operating during the method of FIG. 4.

If at decision block 408, it is determined that the fan device(s) are at maximum operation, the method 400 proceeds to block 412 where the power backup device transmits a throttling instruction to throttle component(s). With reference to FIG. 5E, in an embodiment of block 412 and in response to determining that the air being provided to the BBU device 308a continues to exceed the maximum temperature for the BBU device 308a (at decision block 404) and determining that the fan device 306b is at its maximum operation (at decision block 408), the battery backup charging engine 308b may transmit throttling instructions 508 to the storage devices 304c and 304d. As discussed above, the BBU device 308a may be mapped to the storage devices 304c and 304d in the battery backup charging database 308c. As such, with reference to FIG. 5E, the battery backup charging engine 308b may identify the storage devices 304c and 304d that are mapped to the BBU device 308a due to their configuration that operates to heat air that is provided to BBU device 308a by the fan device 306b, and generate and transmit throttling instructions 508 that are configured to throttle or otherwise reduce the operating level of those storage devices 304c and 304d. As will be appreciated by one of skill in the art in possession of the present disclosure, in response to receiving the throttling instructions 508, the storage devices 304c and 304d will operate to reduce their operating level, thus reducing their temperature.

The method 400 then proceeds to decision block 414 where it is determined whether the air provided to the power backup device exceeds the maximum temperature. As will be appreciated by one of skill in the art in possession of the present disclosure, the throttling of the operation of the storage devices 304c and 304d that operates to reduce the temperature of those storage devices 304c and 304d also provides for a corresponding reduction in the heating of the air 500 that is drawn through the chassis air inlet 302b, past the storage devices 304c and 204d, and provided by the fan device 306b to the BBU device 308a. As such, the contribution to the heating of the air 500 (provided to the BBU device 308a by the fan device 306b) via the operation of the storage devices 304c and 304c will be reduced (or even eliminated if the throttling of the storage devices 304c and 304d is performed to a point where those storages devices 304c and 304d stop operating).

As such, in an embodiment of decision block 414, the BBU device 308a may operate to determine a temperature of air provided by the fan device 306b to the BBU device 308a (e.g., to a BBU device air inlet on the BBU device 308a that allows the air to be moved past the power storage subsystem in the BBU device 308a in order to cool that power storage subsystem.) Similarly as discussed above, the BBU device 308a may retrieve temperature sensor data from the temperature sensor 308d, which as discussed above is positioned in a manner that provides for the reporting of the temperature of the air 500 provided by the fan device 306a to the BBU device 308a, and determine whether that temperature sensor data is indicative of a temperature that exceeds a maximum temperature for the BBU device 308a (e.g., a maximum temperature at which the power storage subsystem in the BBU device 308a is allowed to charge, and above which charging of that power storage subsystem is disabled.)

If, at decision block 414, it is determined that the air provided to the power backup device exceeds the maximum temperature, the method 400 returns to decision block 414 to continue to monitor whether the air provided to the power backup device exceeds the maximum temperature. As such, subsequent to transmitting the throttling instruction at block 412, the BBU device 308a may continue to operate to monitor the air provided to the BBU device 308a until it determines that the temperature of that air no longer exceeds the maximum temperature. If at decision block 414, it is determined that the air provided to the power backup device no longer exceeds the maximum temperature, the method 400 proceeds to block 416 where the power backup device performs charging operations. In an embodiment, at block 416 and once the air provided to the BBU device 308a no longer exceeds the maximum temperature discussed above, the BBU device 308a may operate to charge the power storage subsystem in the BBU device 308a. For example, at block 416, power may be enabled to the power storage subsystem in the BBU device 308a in order to charge the battery, capacitor, and/or other power storage subsystem to a desired level.

The method 400 then proceeds to decision block 418 where it is determined whether the power backup device is charged. In an embodiment, at decision block 418, the BBU device 308a may determine whether its power storage subsystem has been charged to a desired level (e.g., a full charge, a charge above a predetermined charge level, and/or any other charging characteristic that would be apparent to one of skill in the art in possession of the present disclosure). If, at decision block 418, it is determined that the power backup device is not charged, the method returns to block 416. As such, the BBU device 308a may operate to perform charging operations until the power storage subsystem in the BBU device 308a is charged to a desired level.

Figure 5F:
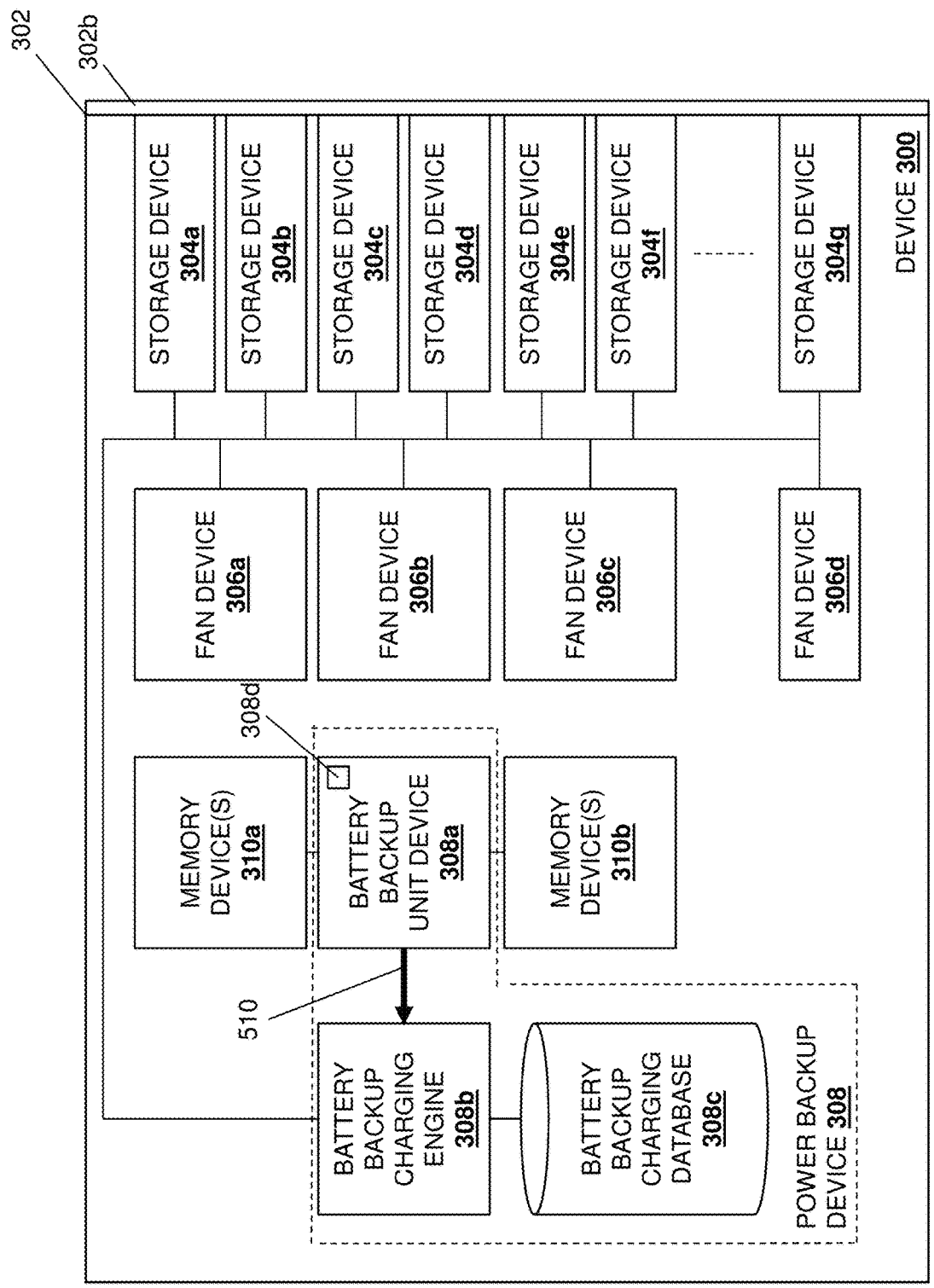
FIG. 5F is a schematic view illustrating an embodiment of the server device of FIG. 3 operating during the method of FIG. 4.
Figure 5G:
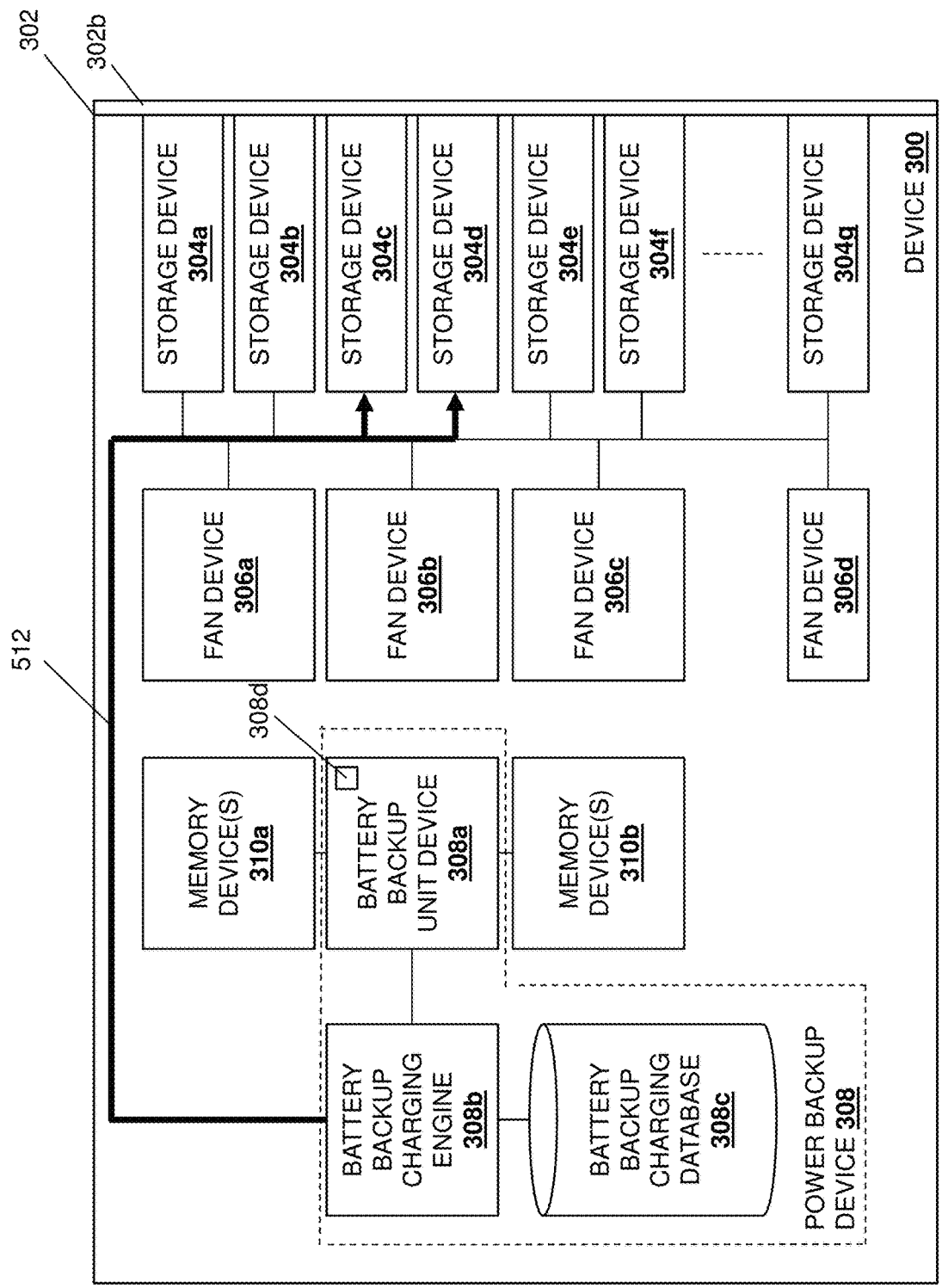
FIG. 5G is a schematic view illustrating an embodiment of the server device of FIG. 3 operating during the method of FIG. 4.

If, at decision block 418, it is determined that the power backup device is charged, the method proceeds to block 420 where the power backup device transmits de-throttling instructions to end throttling of the component(s). With reference to FIG. 5F, in response to determining that the power storage subsystem in the BBU device 308a is charged to the desired level, the BBU device 308a may transmit a desired charge level communication 510 (e.g., an Intelligent Platform Management Interface (IPMI) command) to the battery backup charging engine 308b. With reference to FIG. 5G, at block 420 and in response to receiving the desired charge level communication 510, the battery backup charging engine 308b may generate and transmit de-throttling instructions 512 to the storage devices 304c and 304d that are configured to cause those storage devices 304c and 304d to end the throttling operations and/or otherwise return to their normal/previous operating level. As will be appreciated by one of skill in the art in possession of the present disclosure, in response to receiving the de-throttling instructions 508, the storage devices 304c and 304d will operate to increase their operating level to any desired level from which it was reduced in response to the throttling instructions discussed above. As such, following block 420, that BBU device 308a is charged such that it may provide power to any components (e.g., the memory devices 310a and/or 310b) in the server device 300 in the event of a power loss.

Thus, systems and methods have been described that provide an adaptive component throttling mechanism for a BBU device that requires charging in relatively high temperature environments that would otherwise result in air being provided to the BBU device at a temperature that prevents charging of the power storage subsystem in the BUU device. For example, a chassis may defined a chassis housing and a chassis air inlet to the chassis housing, and at least one storage device may be located in the chassis housing and adjacent the chassis air inlet. A BBU device located opposite the at least one storage device from the chassis air inlet may determine that a charging condition has been satisfied, and then determine that a temperature of air being provided to the BBU device exceeds a threshold temperature. In response, the BBU device provides for the transmission of a throttling instruction that is configured to cause throttling of the at least one storage device. Subsequent to transmitting the throttling instruction, the BBU device may determine that the temperature of the air being provided to the BBU device no longer exceeds the threshold temperature and, in response, may perform charging operations. As such, BBU device charging in high temperature environments is enabled by throttling storage device operation that otherwise heats the air provided to the BBU device until that air is below the temperature that prevents charging of the BBU device.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A component throttling power backup charging system, comprising:
   a chassis defining a chassis housing and a chassis air inlet to the chassis housing;
   at least one component located in the chassis housing and adjacent the chassis air inlet;
   a power backup device located opposite the at least one component from the chassis air inlet, wherein the power backup device is configured to:
      perform training operations to identify that the at least one component is configured to heat air that enters the chassis housing via the chassis air inlet before that air is provided to the power backup device;
      determine that a charging condition has been satisfied;
      determine that a temperature of air being provided to the power backup device exceeds a threshold temperature and, in response, transmit a throttling instruction that is configured to cause throttling of the at least one component identified by the training operations; and
      determine, subsequent to transmitting the throttling instruction, that the temperature of the air being provided to the power backup device no longer exceeds the threshold temperature and, in response, perform charging operations.

2. The system of claim 1, wherein the power backup device is configured to:
   determine that the charging operations have been completed and, in response, transmit a de-throttling instruction that is configured to end the throttling of the at least one component.

3. The system of claim 1, further comprising:

at least one fan device located in the chassis housing and between the at least one component and the power backup system, wherein the power backup system is configured to:
  determine whether the at least one fan device is operating at a maximum speed;
  transmit, in response to the at least one fan device operating below the maximum speed, a fan instruction to increase the speed of the at least one fan device; and
  transmit, in response to the at least one fan device operating at the maximum speed, the throttling instruction.

4. The system of claim 1, further comprising:
  a Baseboard Management Controller (BMC) device located in the chassis housing and coupled to the power backup device and the at least one component, wherein the power backup system is configured to:
    transmit the throttling instruction to the BMC device, wherein the BMC device is configured to throttle the at least one component.

5. The system of claim 1, wherein the power backup device is configured to:
  store, in a power backup device database and based on the training operations, an airflow mapping between the power backup device and the at least one component, wherein the throttling instruction is configured to cause throttling of the at least one component identified in the airflow mapping.

6. The system of claim 1, wherein the training operations include:
  operating at least fan device that is included in the chassis housing;
  sequentially operating, while operating the at least one fan device, each of a plurality of components that are housed in the chassis housing;
  monitoring, while sequentially operating each of the plurality of components, a temperature of air provided to the power backup device to identify that the at least one component is configured to heat air that enters the chassis housing via the chassis air inlet before that air is provided to the power backup device.

7. An Information Handling System (IHS), comprising:
  a processing system; and
  a memory system that is coupled to the processing system and that includes instructions that, when executed by the processing system, cause the processing system to provide a power backup engine that is configured to:
    perform training operations to identify that at least one component included in a chassis is configured to heat air that enters the chassis via a chassis air inlet before that air is provided to a power backup device that is included in the chassis;
    determine that a charging condition has been satisfied;
    determine that a temperature of air being provided to the power backup device exceeds a threshold temperature and, in response, transmit a throttling instruction that is configured to cause throttling of the at least one component identified by the training operations; and
    determine, subsequent to transmitting the throttling instruction, that the temperature of the air being provided to the power backup device no longer exceeds the threshold temperature and, in response, perform charging operations.

8. The IHS of claim 7, wherein the power backup engine is configured to:
  determine that the charging operations have been completed and, in response, transmit a de-throttling instruction that is configured to end the throttling of the at least one component.

9. The IHS of claim 7, wherein the power backup engine is configured to:
  determine whether at least one fan device that is located between the power backup device and the at least one component is operating at a maximum speed;
  transmit, in response to the at least one fan device operating below the maximum speed, a fan instruction to increase the speed of the at least one fan device; and
  transmit, in response to the at least one fan device operating at the maximum speed, the throttling instruction.

10. The IHS of claim 7, wherein the power backup engine is configured to:
  transmit the throttling instruction to a BMC device that is coupled to the at least one component to cause the BMC device to throttle the at least one component.

11. The IHS of claim 7, wherein the power backup engine is configured to:
  storing, in a power backup device database and based on the training operations, an airflow mapping between the power backup device and the at least one component, wherein the throttling instruction is configured to cause throttling of the at least one component identified in the airflow mapping.

12. The IHS of claim 7, wherein the training operations are performed during initialization operations by the processing system and include:
  operating at least fan device that is included in the chassis;
  sequentially operating, while operating the at least one fan device, each of a plurality of components that are housed in the chassis;
  monitoring, while sequentially operating each of the plurality of components, a temperature of air provided to the power backup device to identify that the at least one component is configured to heat air that enters the chassis via the chassis air inlet before that air is provided to the power backup device.

13. The IHS of claim 7, wherein the power backup engine is configured to:
  detect a power loss to at least one power backed up subsystem and, in response, provide power to the power backed up subsystem.

14. A method for providing component throttling power backup device charging, comprising:
  performing, by a power backup device that is included in a chassis, training operations to identify that at least one component included in the chassis is configured to heat air that enters the chassis via a chassis air inlet before that air is provided to the power backup device;
  determining, by the power backup device, that a charging condition has been satisfied;
  determining, by the power backup device, that a temperature of air being provided to a power backup device exceeds a threshold temperature and, in response, transmitting a throttling instruction that is configured to cause throttling of the at least one component identified by the training operations; and
  determining, by the power backup device subsequent to transmitting the throttling instruction, that the temperature of the air being provided to the power backup device no longer exceeds the threshold temperature and, in response, performing charging operations.

15. The method of claim 14, further comprising:

determining, by the power backup device, that the charging operations have been completed and, in response, transmit a de-throttling instruction that is configured to end the throttling of the at least one component.

16. The method of claim 14, further comprising:
determining, by the power backup device, whether at least one fan device that is located between the power backup device and the at least one component is operating at a maximum speed;
transmitting, by the power backup device in response to the at least one fan device operating below the maximum speed, a fan instruction to increase the speed of the at least one fan device; and
transmitting, by the power backup device in response to the at least one fan device operating at the maximum speed, the throttling instruction.

17. The method of claim 14, further comprising:
transmitting, by the power backup device, the throttling instruction to a BMC device that is coupled to the at least one component to cause the BMC device to throttle the at least one component.

18. The method of claim 14, further comprising:
storing, by the power backup device in a power backup device database and based on the training operations, an airflow mapping between the power backup device and the at least one component, wherein the throttling instruction is configured to cause throttling of the at least one component identified in the airflow mapping.

19. The method of claim 14, wherein the training operations include:
operating at least fan device that is included in the chassis;
sequentially operating, while operating the at least one fan device, each of a plurality of components that are housed in the chassis;
monitoring, while sequentially operating each of the plurality of components, a temperature of air provided to the power backup device to identify that the at least one component is configured to heat air that enters the chassis via the chassis air inlet before that air is provided to the power backup device.

20. The method of claim 14, further comprising:
detecting, by the power backup device, a power loss to at least one power backed up subsystem and, in response, provide power to the power backed up subsystem.

\* \* \* \* \*